United States Patent
Jeansonne

Patent Number: 5,982,633
Date of Patent: *Nov. 9, 1999

[54] OPPOSED BALL GRID ARRAY MOUNTING

[75] Inventor: Jeff K. Jeansonne, Houston, Tex.

[73] Assignee: Compaq Computer Corporation, Houston, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/914,978

[22] Filed: Aug. 20, 1997

[51] Int. Cl.$^6$ .............................. H05K 7/02; H01L 23/12; H01L 23/538; H01L 23/488

[52] U.S. Cl. ........................ 361/782; 361/774; 361/777; 361/783; 361/766

[58] Field of Search .................................. 174/260, 261, 174/262; 228/180.21, 180.22; 257/723, 724, 738, 778, 780, 779, 786, 692; 361/763, 765, 766, 760, 772, 773, 774, 779, 782, 783, 811, 820, 821; 438/108; 439/68, 82; 338/239, 260, 319, 320, 324; 333/181, 184, 185, 172; 365/52, 51, 63

[56] References Cited

U.S. PATENT DOCUMENTS

| | | | |
|---|---|---|---|
| 4,774,632 | 9/1988 | Neugebauer | 361/760 |
| 5,252,857 | 10/1993 | Kane et al. | 257/724 |
| 5,355,283 | 10/1994 | Marrs et al. | 361/760 |
| 5,424,492 | 6/1995 | Petty et al. | 174/262 |
| 5,455,456 | 10/1995 | Newman | 257/738 |
| 5,477,082 | 12/1995 | Buckley, III et al. | 257/723 |
| 5,530,288 | 6/1996 | Stone | 257/738 |
| 5,557,502 | 9/1996 | Banerjee et al. | 174/261 |
| 5,633,785 | 5/1997 | Parker et al. | 361/766 |
| 5,701,032 | 12/1997 | Fischer et al. | 257/692 |
| 5,729,438 | 3/1998 | Pieper et al. | 361/766 |
| 5,798,567 | 8/1998 | Kelly et al. | 257/778 |

OTHER PUBLICATIONS

IBM Technical Disclosure Bulletin "System Electronic Packaging Architecture", vol. 38, No. 12, Dec. 1995.
IBM Technical Disclosure Bulletin vol. 15 No. 4 pp. 1281, Sep. 1972.
IBM Technical Disclosure Bulletin vol. 38 No. 01 pp. 137 and 138, Jan. 1995.

*Primary Examiner*—Donald Sparks
*Attorney, Agent, or Firm*—Conley, Rose & Tayon, P.C.; Michael F. Heim; Jonathan M. Harris

[57] ABSTRACT

A printed circuit board or card includes a pair of ball grid array packages connected one over the other on opposite sides of the board or card. The packages may connect through feed-through vias so that board space on the underside of the board, populated by feed-through vias, can be utilized to provide additional functionality. In one implementation, GTL resistive terminations and decoupling capacitors may be included in the ball grid array package on the underside of the board or card.

19 Claims, 2 Drawing Sheets

OPPOSED BALL GRID ARRAY MOUNTING

BACKGROUND OF THE INVENTION

This invention relates generally to techniques for providing electrical components on printed circuit boards or cards.

In a wide variety of electronic devices, space is often at a premium in order achieve small device size. This is particularly true in a variety of computer applications and most particularly true in connection with portable computers.

The demands for available board space has increased with the introduction of the Pentium® II brand processor from Intel Corporation. This processor uses Gunning transceiver logic ("GTL"), which requires parallel resistive terminations for all GTL signals. The number of GTL signals between the processor and bridge can be in the range of 150, each of which must be connected to a parallel pull up resistive termination. Decoupling capacitors are typically utilized to provide high frequency capacitive decoupling in computer systems. From 30 to 40 decoupling capacitors may be needed in a portable computer using GTL. Thus, the demands for limited PCB or card space are strained even further by the additional device requirements brought on in recent vintage processors.

Ball grid array ("BGA") packages have become increasingly popular for a large variety of applications Fundamental limitations on wire bonding technology and pad pitch have made some existing industry standard packages, such as plastic quad flat pack ("PQFP") packages, technology roadblocks when the input/output pin count must exceed 250 to 300. In addition, BGA packages can have internal ground and power planes for high frequency operation. These internal planes provide impedance control, limiting the effective inductance seen by the silicon device. This may increase the useable operating frequencies of the silicon device due to the reduction of package related noise and cross-talk.

While there are a wide variety of options available in the general field of BGA's, there are two well known BGA packages. One BGA package uses an over molded pad array carrier ("OMPAC") while the other uses a substrate material that is ceramic ("CBGA"). Generally, BGA packages include a die carrier and a plurality of solder balls or bumps beneath the die carrier which connect to contacts formed on a board or card. These contacts may communicate via metal lines with vias which extend through the board. The portion of the board on the underside of a BGA package is generally too populated with via holes to provide useful space for additional devices.

SUMMARY OF THE INVENTION

In accordance with one aspect of the present invention, a board for connecting electronic devices includes a plurality of feed-through vias extending through the board. A first ball grid array package is connected to the vias on a first side of the board. A second ball grid array package is connected to the first ball grid array package through the vias, the second ball grid array package positioned on a second side of the board.

In accordance with another aspect of the present invention, a computer system includes a board with a processor mounted thereon. A plurality of electronic components are mounted on the board in electrical communication with the processor. A first ball grid array package is mounted on the board in communication with the processor. A second ball grid array package is mounted on the board underneath the first ball grid array package.

In accordance with yet another aspect of the present invention, a method for connecting ball grid array packages to a board includes the step of securing a first ball array package to a first surface of the board. A second ball grid array package is secured to the board on the opposite side of the board directly beneath the first ball grid array package.

The details of one or more embodiments of the invention are set forth in the accompanying drawings and description below. Other features, objects and advantages of the invention will be apparent from the description and drawings, and from the claims.

DESCRIPTION OF THE PREFERRED EMBODIMENTS

Figure 1:
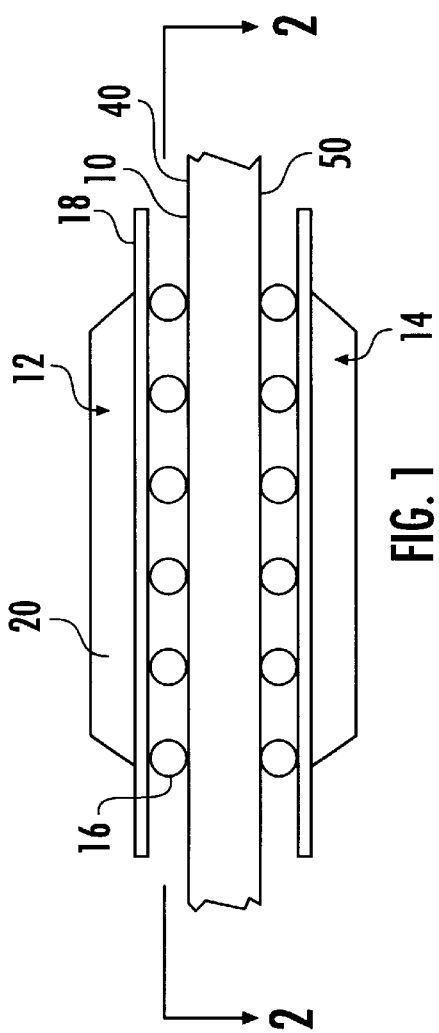
FIG. 1 is a partial enlarged side elevational view of one embodiment of the present invention.

Referring to the drawing wherein like reference characters are utilized for like parts throughout the several views, a printed circuit board (PCB) or card, hereafter collectively referred to as a board 10, has mounted on opposing sides, a first BGA package 12 and a second BGA package 14. Each of the BGA packages 12 and 14 includes a plurality of solder balls or bumps 16. Each package also includes a PCB 18 and a die 52 containing structure 20, which could be, for example, epoxy over molded in the case of OMPAC packages or substrate material-ceramic for CBGA packages. If desired, the same pattern and arrangement of solder balls 16 can be used for both packages 12 and 14.

Figure 2:
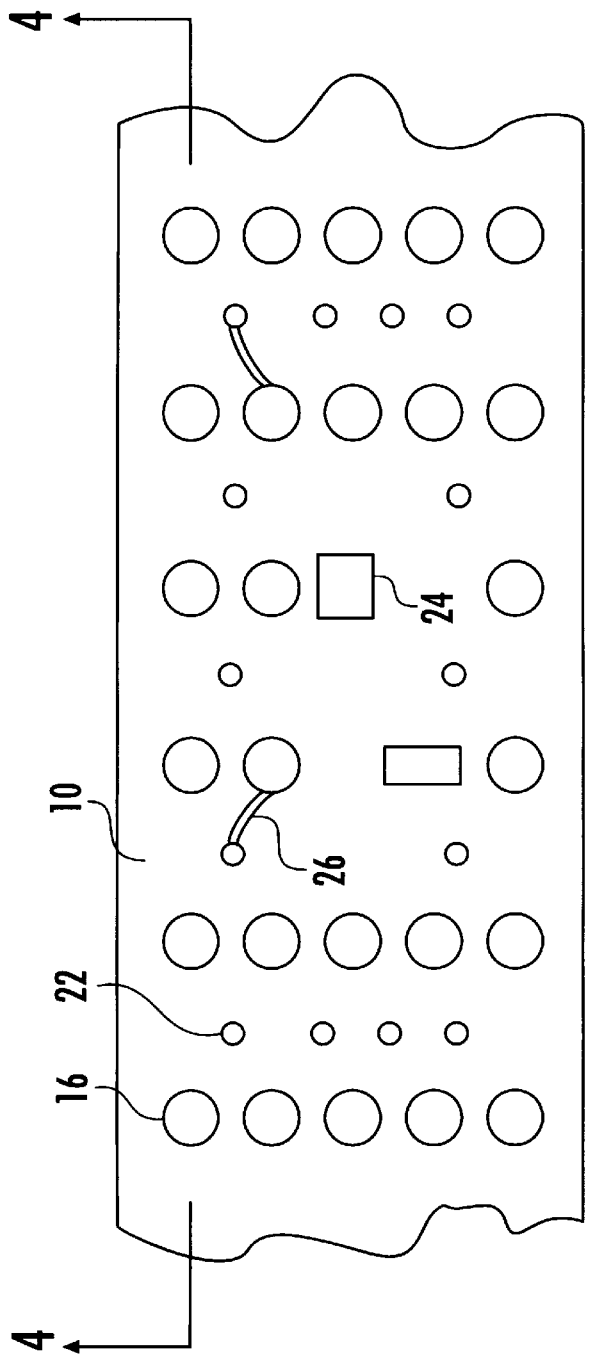
FIG. 2 is an enlarged, cross-sectional view taken generally along the line 2—2 of FIG. 1.

As shown in FIG. 2, the solder balls 16 are arranged generally in an array around a series of vias 22 which extend through the board 10. Connections can be made to metal lined vias 22 by metal traces 26. Thus, communication between the top surface 40 of the board 10 and the lower surface 50 of the board 10 can occur through the metal lined vias 22. Advantageously, connections with power or ground planes on the underside of the board 10 can then be made using these vias 22. In addition, some packaged electronic devices 24 may be situated where permitted by the arrangement of vias 22 underneath the BGA's 12 or 14. However, the high population of vias 22 otherwise makes connection of electronic devices under BGAs impractical.

Figure 3:
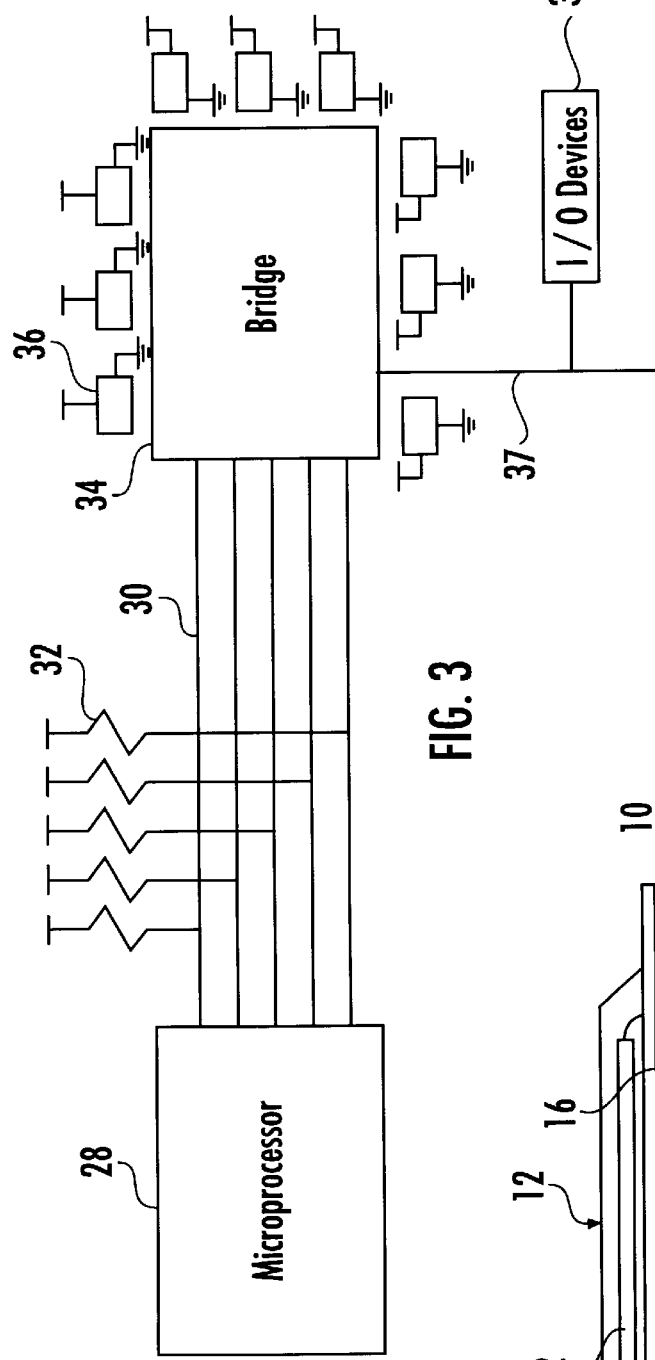
FIG. 3 is a schematic view of a computer system.
Figure 5:
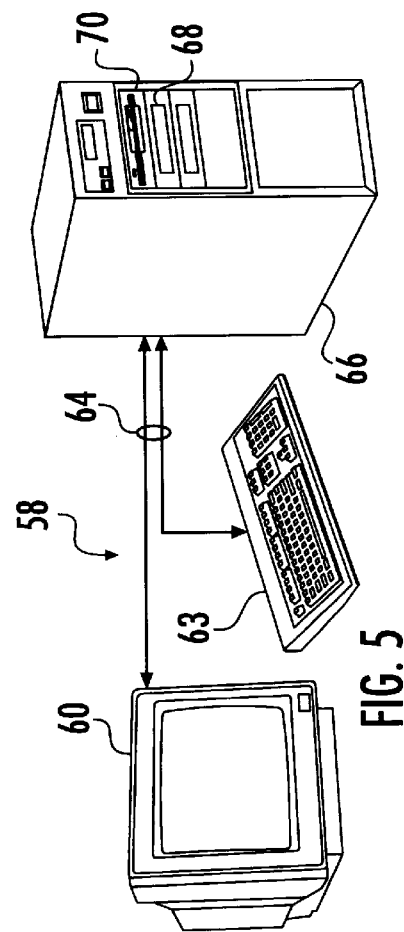
FIG. 5 is a depiction of a computer system.

Referring now to FIG. 3, a microprocessor 28, which may be a Pentium® II microprocessor available from Intel, communicates with a typical bridge 34. The bridge 34 may connect by a bus 37 to one or more input/output devices 38. A computer system 58 which could include, a disk drive 68, a CD ROM drive 70, a monitor 60, or a keyboard 63, for example, connected by cables 64, as shown in FIG. 5.

In the case of the Pentium® II processor, GTL signal paths 30 connect the processor 28 and the bridge 34. While only a few paths 30 are shown in FIG. 3 for illustration purposes, a number of such paths, perhaps exceeding 100 signal paths, may be utilized. Each of the paths includes a parallel resistive pull up termination 32 in conventional GTL designs. In addition, a plurality of high frequency decoupling capacitors 36 are utilized in connection with the bridge 34 in conventional GTL designs.

Thus, the already crowded board 10 must now accommodate a large number of resistive terminations 32 all connected to the power plane and a large number of decoupling capacitors 36 connected to the power plane and to the ground plane.

By using the opposed configuration of BGA packages 12 and 14, the real estate on the underside 50 of the board 10 may be effectively utilized despite the presence of multiple vias 22. As a result, more effective utilization of the entire available board 10 area may be achieved.

Figure 4:
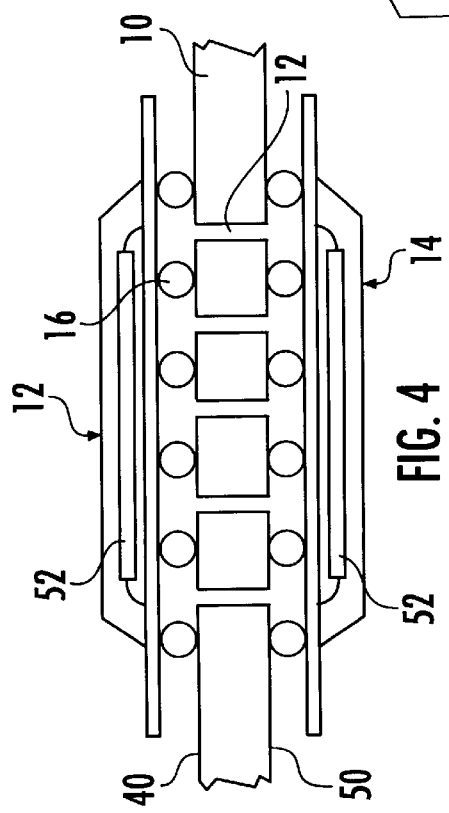
FIG. 4 is a cross-sectional view taken generally along the line 4—4 of FIG. 2.

Moreover, in one specific application, the resistive terminations 32 and decoupling capacitors 36 may all be provided in the lower BGA 14. The devices 32 and 36 do not need to extensively connect to other components inside the package 12. The necessary connections can readily be made through the metal lined vias 22, as illustrated in FIG. 4, by way of metal traces such as the traces at 26 in FIG. 2.

Since the same feed-through vias 22 are used for both packages 12 and 14, the opposed BGA layout is easy. Moreover, the otherwise unusable space on the underside board 50 underneath the upper BGA package 12, is effectively utilized. While the arrangement shown in FIG. 2 has been described in connection with implementing a GTL design involving multiple resistive terminations and decoupling capacitors, other applications may exist which can utilize the space saving arrangement described herein.

While the present invention has been described with respect to a single preferred embodiment, those skilled in the art will appreciate numerous modifications and variations and it is intended that the appended claims cover all such modifications and variations as fall within the true spirit and scope of the present invention.

What is claimed is:

1. A board for connecting electronic devices, said board having opposing first and second sides, said board comprising:

a first ball grid array package mounted on the first side of the board;

a second ball grid array package mounted on the second side of the board;

a plurality of feed-through vias extending through said board to connect said first ball grid array package to said second ball grid array package;

an integrated circuit (IC) mounted on said board connected to said first ball grid array package through a plurality of signal paths; and wherein said second ball grid array package includes pull-up resistors connected to said vias to pull high the signal paths between said IC and said first ball grid array package.

2. The board of claim 1 wherein said second ball grid array includes decoupling capacitors.

3. The board of claim 2 wherein said IC is a processor.

4. The board of claim 3 wherein said processor uses Gunning transceiver logic.

5. The board of claim 1 wherein said first and second ball grid array packages are situated one directly above the other.

6. The board of claim 5 wherein each of said ball grid array packages has solder balls, said balls of each package having the same arrangement.

7. The board of claim 1 wherein said IC is mounted on the first side of the board.

8. The board of claim 1 wherein said plurality of pull-up resistors includes more than 100 resistors.

9. A computer system comprising:

a board;

a processor mounted on said board;

a bridge mounted on said board in a first ball grid array package and connected to said processor;

signal lines connecting said processor to said bridge;

a second ball grid array package connected to said first ball grid array package through said board, said second ball grid array containing decoupling capacitors connected to power and ground planes and pull-up resistors connected to said signal lines to pull said signal lines high; and an input/output device coupled to the processor.

10. The system of claim 9 wherein said first and second ball grid array packages are connected through feed-through vias.

11. The system of claim 9 wherein said system uses Gunning transceiver logic.

12. The system of claim 9 wherein said input/output device is connected to said bridge.

13. The system of claim 9 wherein said input/output device is a monitor.

14. The system of claim 9 wherein said input/output device is a keyboard.

15. The system of claim 9 wherein said input/output device is a disk drive.

16. A method for connecting ball grid array packages to a board comprising the steps of:

securing a first ball grid array package to a first surface of said board;

securing a second ball grid array package containing decoupling capacitors to said board on the opposite side of said board directly beneath said first ball grid array package; and connecting said decoupling capacitors to power and ground planes;

securing an integrated circuit to the board; and connecting the integrated circuit to the first ball array package by way of a plurality of signal paths; and electrically connecting pull-up resistors within the second ball array package to the signal paths between the integrated circuit and the first ball array package.

17. The method of claim 16 including the step of electrically connecting said packages through said board.

18. The method of claim 17 including the step of connecting one of said packages to the other by way of feed through vias through said board.

19. The method of claim 18 including the step of causing the solder balls of each package to align with the solder balls of the other package.

* * * * *